(12) United States Patent
Eugeni (10) Patent No.: US 10,895,809 B2
(45) Date of Patent: Jan. 19, 2021

(54) METHOD FOR THE ALIGNMENT OF PHOTOLITHOGRAPHIC MASKS AND CORRESPONDING PROCESS FOR MANUFACTURING INTEGRATED CIRCUITS IN A WAFER OF SEMICONDUCTOR MATERIAL

(71) Applicant: LFOUNDRY S.R.L., Avezzano (IT)

(72) Inventor: Gianluca Eugeni, Avezzano (IT)

(73) Assignee: LFOUNDRY S.R.L

( * ) Notice: Subject to any disclaimer, the term of this patent is extended or adjusted under 35 U.S.C. 154(b) by 0 days.

(21) Appl. No.: 16/630,129

(22) PCT Filed: Jul. 13, 2018

(86) PCT No.: PCT/IB2018/055208
§ 371 (c)(1),
(2) Date: Jan. 10, 2020

(87) PCT Pub. No.: WO2019/012499
PCT Pub. Date: Jan. 17, 2019

(65) Prior Publication Data
US 2020/0166853 A1 May 28, 2020

(30) Foreign Application Priority Data

Jul. 13, 2017 (IT) .................. 102017000079201

(51) Int. Cl.
*G03F 9/00* (2006.01)
*G03F 7/20* (2006.01)

(52) U.S. Cl.
CPC ........ *G03F 7/70475* (2013.01); *G03F 9/7084* (2013.01)

(58) Field of Classification Search
CPC ............ G03F 7/70616; G03F 7/70425; G03F 7/7007; G03F 7/70475; G03F 9/7084
(Continued)

(56) References Cited

U.S. PATENT DOCUMENTS 5,440,138 A   8/1995 Nishi
6,104,471 A   8/2000 Morioka et al.
(Continued)

OTHER PUBLICATIONS

PCT International Search Report and Written Opinion for PCT Application No. PCT/IB2018/055208, dated Oct. 24, 2018, pp. 1-13.

*Primary Examiner* — Hung Nguyen
(74) *Attorney, Agent, or Firm* — The Belles Group, P.C.

(57) ABSTRACT

A photomask alignment method for a manufacturing process of an integrated circuit in a semiconductor material wafer (20), the method envisaging: at a first level, defining, by means of a single photolithography process, at least one alignment structure (10; 10') on the wafer (20), the alignment structure (10; 10') having at least a first (4a) and a second (4b) reference mark; and, at an upper level, higher than the first one, aligning a first field mask (11a) relative to the at least one first reference mark (4a); and aligning a second field mask (11b), which is used, together with the first field mask (11a), for the photolithography formation of the integrated circuit inside a respective die (22) in the wafer (20), relative to the at least one second reference mark (4b), so that the first and second field masks (11a, 11b) are arranged on the wafer (20) adjacent to one another in a first coupling direction, without any mutual overlapping.

17 Claims, 7 Drawing Sheets

(58) Field of Classification Search
USPC .................................... 355/52, 53, 55, 77
See application file for complete search history.

(56) References Cited

U.S. PATENT DOCUMENTS

| | | | |
|---|---|---|---|
| 6,455,211 B1* | 9/2002 | Yui | G03F 7/70425 |
| | | | 430/22 |
| 2004/0156027 A1 | 8/2004 | Best et al. | |
| 2008/0032203 A1 | 2/2008 | Phillipps et al. | |
| 2012/0202138 A1 | 8/2012 | Lam | |
| 2015/0022797 A1* | 1/2015 | Miyazaki | G03F 7/70616 |
| | | | 355/67 |
| 2015/0074621 A1* | 3/2015 | Endo | G03F 9/7046 |
| | | | 716/54 |
| 2016/0334674 A1 | 11/2016 | Yu et al. | |

* cited by examiner

METHOD FOR THE ALIGNMENT OF PHOTOLITHOGRAPHIC MASKS AND CORRESPONDING PROCESS FOR MANUFACTURING INTEGRATED CIRCUITS IN A WAFER OF SEMICONDUCTOR MATERIAL

CROSS-REFERENCE TO RELATED PATENT APPLICATIONS

The present application is a U.S. national stage application under 35 U.S.C. § 371 of PCT Application No. PCT/IB2018/055208, filed Jul. 13, 2018, which claims priority to Italian Patent Application No. 102017000079201, filed Jul. 13, 2017. The disclosures of the aforementioned priority applications are incorporated herein by reference in their entireties.

CROSS-REFERENCE TO RELATED APPLICATIONS

This application claims priority from Italian Patent Application No. 102017000079201 filed on Jul. 13, 2017, the disclosure of which is incorporated by reference.

TECHNICAL FIELD

The invention relates to a method for the alignment of photolithographic masks (photomasks) and to a corresponding process for manufacturing integrated circuits in a wafer of semiconductor material through photolithography techniques.

BACKGROUND ART

As it is known, photolithography techniques are largely used in the manufacturing of integrated circuits, for example CMOS circuits, starting from a so-called wafer made of a semiconductor material, usually silicon.

Photomasks are used to optically transfer (namely, print) images or patterns concerning an integrated circuit to be manufactured onto a wafer coated with a layer of photosensitive material (so-called photoresist).

An optical photolithography machine (so-called stepper) is properly positioned above the wafer so as to project light through the photomask and print a corresponding image related to the integrated circuit to be manufactured onto a printing field of the wafer coated with the photoresist layer; this printing field has an extension that corresponds to the optical aperture area of the photolithography machine.

In a known manner, when using a positive photoresist, the regions of the photoresist layer that are exposed to the light through the photomask are removed so that regions of the wafer underneath are free to be processed, for example through etching, to form channels or trenches, or by means of ion implantation for the doping of the semiconductor material, for the formation of material layers, for example comprising a conductor or semiconductor or dielectric material, which will have a shape and a pattern corresponding to the image defined by the photomask.

Alternatively, a negative photoresist can be used, in which case the non-printed regions of the photoresist (namely those that are not exposed to the light) are removed so that regions of the wafer underneath are left uncovered, thus allowing them to be properly processed (for example through etching or ion implantation).

In any case, after the image corresponding to the photomask has been printed onto a wafer printing field, the optical photolithography machine moves or steps the wafer by one step relative to the optics, so as to print the image onto another field of the wafer, which is adjacent to the field that has already been printed (for example as it is arranged on a same row—or column—into which the wafer can be divided, the wafer featuring a regular pattern of these printing fields).

Then, the photolithography process is repeated until the entire surface of the wafer is covered and the photoresist layer coating the aforesaid wafer is printed in a desired manner; subsequently, the manufacturing procedure comprises wafer processing steps, in the areas that were exposed, such as—for example—the aforesaid etching or ion implantation steps.

In a known manner, the processing steps for the manufacturing of the printing circuit can involve the use of a proper number of photomasks. In particular, integrated circuits typically consist of different levels or overlaying layers (for example different metallization layers with interposed dielectric layers, in case of CMOS circuits), each one of these layers being properly processed; as a consequence, the wafer printing photolithography procedure is repeated for each level, using respective photomasks.

The size of the wafer printing field is typically smaller, for example four or five times smaller, than the size of the corresponding photomask field, so as to project portions of the circuit on nanometre scales, which are otherwise impossible to be obtained in practice.

On an average, a single printing field can project onto the wafer an area having the size of N×M dies, a die being equal to the size of a single unit into which the wafer will be divided and containing an entire copy of the integrated circuit. In a known manner, indeed, the wafer is processed for the simultaneous formation of a plurality of elementary units, namely the aforesaid dies; at the end of the processing, the wafer is cut along scribe lines, thus carrying out the so-called sawing operation, so as to separate (or single-out) the different dies, which can be then subjected to conclusive processing actions, for example encapsulation in a relative package and definition of a resulting chip.

In this way, the size of the single die of the integrated circuit to be manufactured is equal—at most—to the size of the wafer printing field, which, in turn, is determined by the maximum aperture that can be obtained with an optical photolithography machine, for example equal to 26×33 mm.

However, there are cases in which the size of the die of the integrated circuit to be manufactured need to be larger than the size of the field printed by the optical photolithography machine; this is often the case, for example, with power integrated circuits or with so-called full-frame CMOS image devices.

In this case, two or more printing fields need to be joined, namely stitched together, hence carrying out a so-called stitching operation, so that the images printed on the wafer through the corresponding photomasks (hereinafter referred to as field masks) can be jointed with utmost accuracy, so as to enable—together—the creation of the overall integrated circuit.

Evidently, for this joining or stitching operation, a high level of precision is required when positioning the field masks of the different printing fields, so as to ensure the correct formation of the resulting integrated circuit.

Known solutions for the aforesaid precise positioning involve use of alignment marks, which are printed onto the wafer through the field masks. Since the accuracy of the stitching between the printing fields depends, at each level, on the accuracy of the positioning of the alignment marks of the lower (or previous) layer, it is evident that the correct positioning of the first-level masks (also called zero masks) turns out to be crucial, as, in this case, there are no marks on a lower level that can be used for the alignment.

A known solution to ensure the alignment at the first level is now discussed with reference to FIGS. 1A and 1B.

Field masks, indicated in general with number 1, have sizes that are equal to the entire exposure aperture of the optical photolithography machine, in this case with a substantially rectangular (or square) shape in plan view.

At the first level, field masks 1 are used to print onto the wafer joining marks, also called stitching marks, indicated with number 2, which are printed at each side of each field mask 1. These stitching marks 2 are typically printed close to the scribe lines, namely in the areas of the wafer that will be subsequently eliminated during the cutting operation to which the wafer is subjected to define the dies.

Figure 1A:
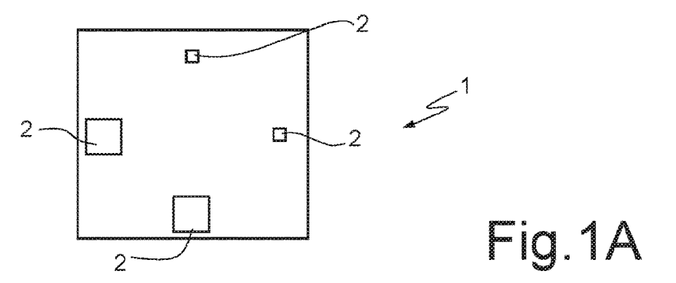
FIG. 1A is a schematic representation of a known field mask for a photolithography process.

For example, as shown in FIG. 1A, the stitching marks 2 are shaped like rectangles or squares and have a first size along two first sides of the field mask 1 facing one another and a second size, which is greater than the first one, along the other two sides of the field mask 1 facing one another.

Figure 1B:
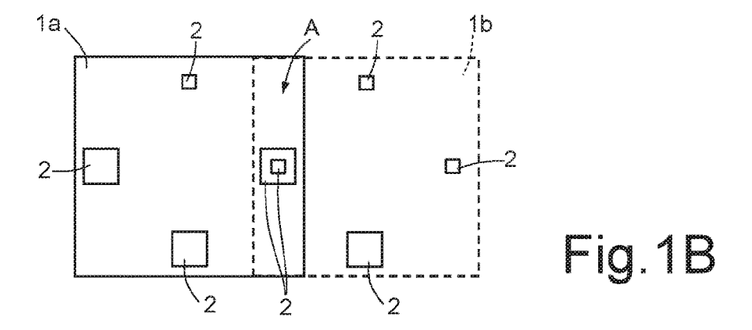
FIG. 1B is a schematic representation of the stitching of two known field masks.

As schematically shown in FIG. 1B, in order to stitch two printing fields, a following field mask, indicated with 1b, is positioned relative to a previous field mask, indicated with 1a, in such a way that the corresponding stitching marks 2 overlap. In particular, by so doing, a stitching mark with a larger size (defined by field mask 1b) encloses on the inside the stitching mark with a smaller size (defined by field mask 1a), and the two field masks 1a, 1b overlap at an overlay area, indicated with A, which includes the aforesaid stitching marks 2.

This solution offers the possibility of measuring the alignment between the printing fields through the measurement of the correct mutual positioning of the stitching marks 2 and, if required, the execution of suitable positioning corrections, also known as zero-level adjusting operations. In particular, should the alignment of the wafer prove to not be correct, the non-compliant wafer can be discarded and suitable changes can be made in the alignment between the printing fields of the following wafer being processed.

Figure 1C:
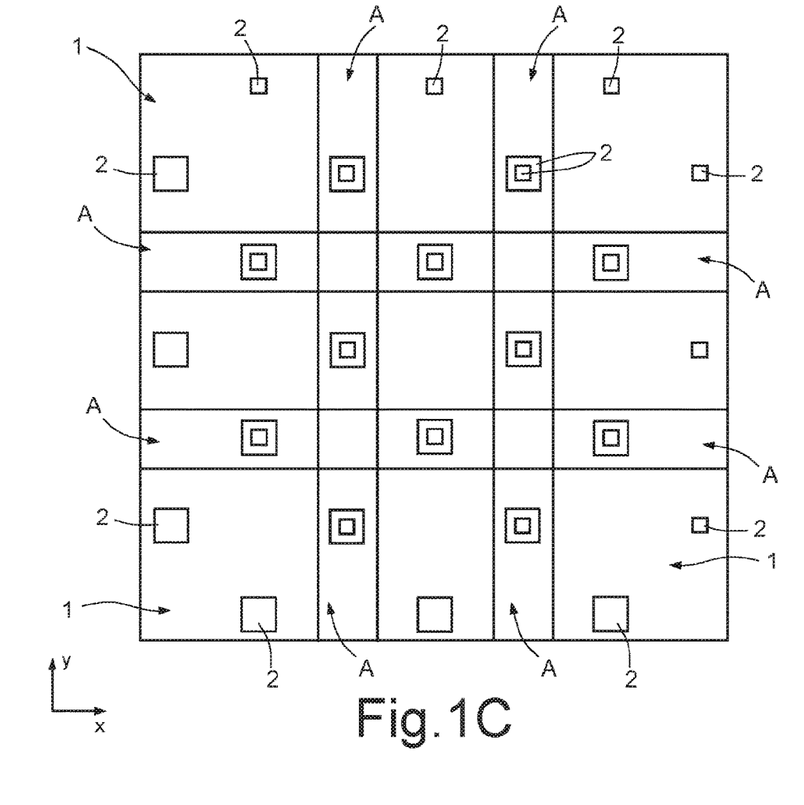
FIG. 1C is a schematic representation of the stitching of a plurality of known field masks.

With reference to FIG. 1C, a coupling may be envisaged between two (or more) printing fields in a first horizontal direction x or in a second horizontal direction y of a horizontal plane xy on which the wafer lies; similarly, there can be a coupling in both horizontal directions x, y of the aforesaid horizontal plane xy (as there are corresponding overlay areas A where the stitching marks 2 are located).

Figure 2:
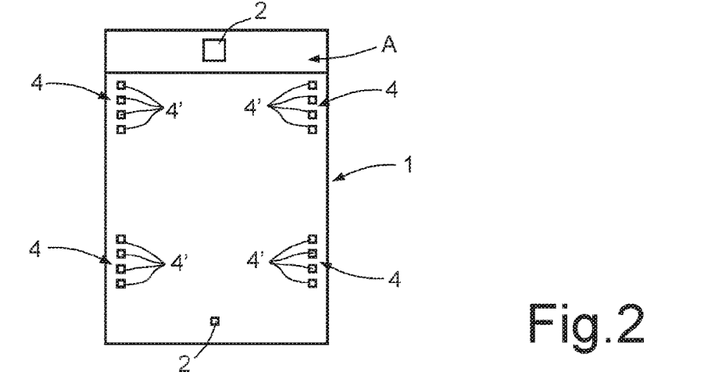
FIG. 2 is a schematic representation of a further known field mask.

As shown in FIG. 2, furthermore, it is also possible that, again at the zero mask level, the field masks 1 are used also to print onto the wafer reference marks (also called overlay marks) for the alignment of the field masks of the following levels. These reference marks 4, as well, are typically printed close to the scribe lines.

As in the example shown, the reference marks 4 can be printed at the four corners of each field mask 1 and they can include a plurality of reference elements 4', each one for the alignment of a respective one of the following mask levels, thus ensuring the correct overlay of the following mask levels (also known as layer-to-layer alignment).

Assuming that an accurate stitching is carried out at the first level, thanks to the measurement and correction operations enabled by the stitching marks 2 (as discussed above), use of the reference marks 4 allows to carry out an accurate stitching of the printing fields also at the subsequent levels, basically with the same accuracy as the first level.

The solution described above, despite being effective in ensuring a correct alignment of the field masks, is affected by some problems in case the die size is larger than the area printed by the optical photolithography machine.

First of all, the presence of the overlay area A does not allow to make use of the entire printed field for the manufacturing of the integrated circuits; this feature can pose a significant limitation, especially for devices in which small sizes are required.

Furthermore, this solution involves the measurement and correction of alignment errors between field masks at the first level; these measurement and correction operations, besides increasing the manufacturing times for the production of the integrated circuits and leading to a reduction of the efficiency of the process (in case of rejection of non-compliant wafers), can be subjected to mistakes and may cause consequent errors in the alignment of all subsequent mask levels.

Figure 3A:
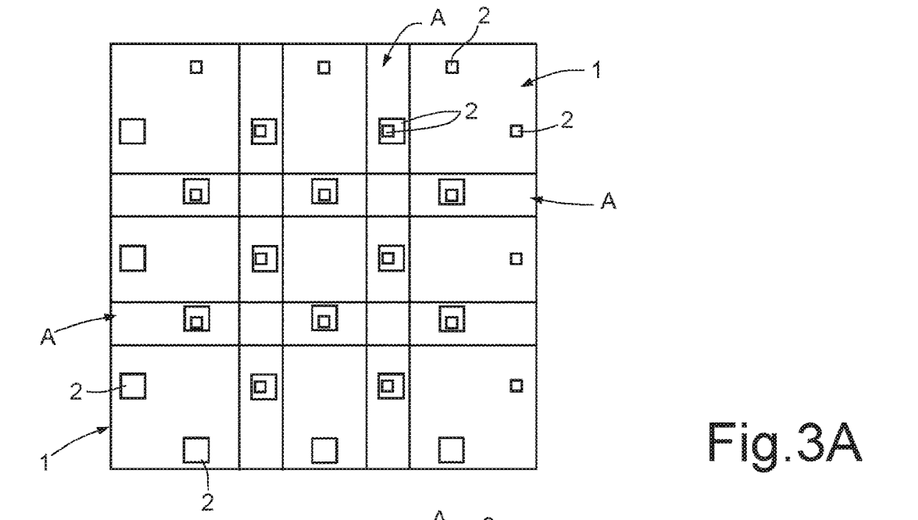
FIGS. 3A and 3B are schematic representations concerning alignment errors in the stitching of field masks.
Figure 3B:
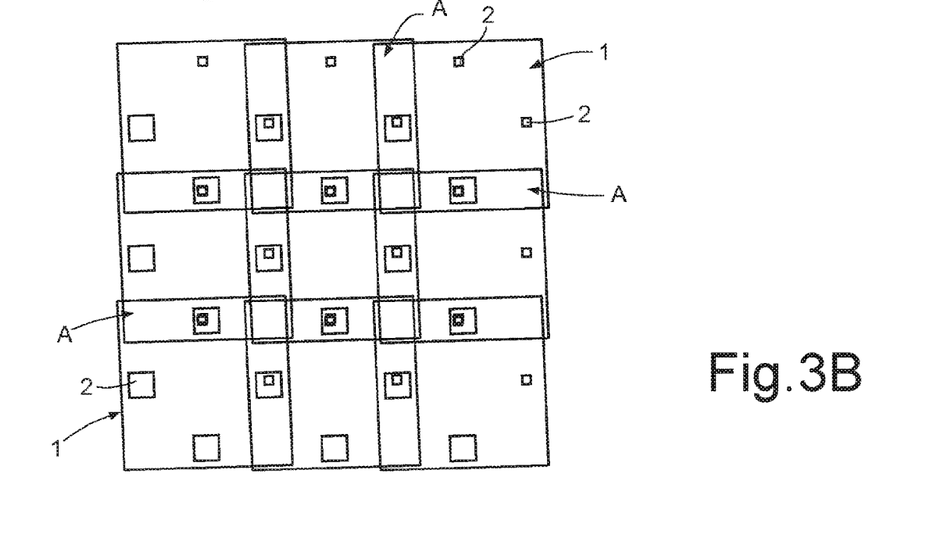

In this respect, FIGS. 3A and 3B show two possible types of alignment errors, namely the so-called shot magnification error (FIG. 3A) and the so-called shot rotation error (FIG. 3B), which can occur in the stitching of printing fields for a photolithography process.

DISCLOSURE OF INVENTION

The aim of the invention is to provide an improved solution for the alignment of photomasks, which allows to overcome the drawbacks of the prior art.

According to the invention, a method for the alignment of photomasks and a corresponding process for manufacturing an integrated circuit are provided, as set forth in the appended claims.

BRIEF DESCRIPTION OF THE DRAWINGS

The invention will be best understood upon perusal of the following detailed description of preferred embodiments, by mere way of non-limiting example, and with reference to the accompanying drawings, in which.

BEST MODE FOR CARRYING OUT THE INVENTION

As explained in more details below, an aspect of the invention involves, in general, obtaining the alignment of the field masks of the mask levels following the first one using the sole reference marks made at the first mask level, thus without using stitching marks and the relative alignment measurements as well as possible corrections.

Figure 4:
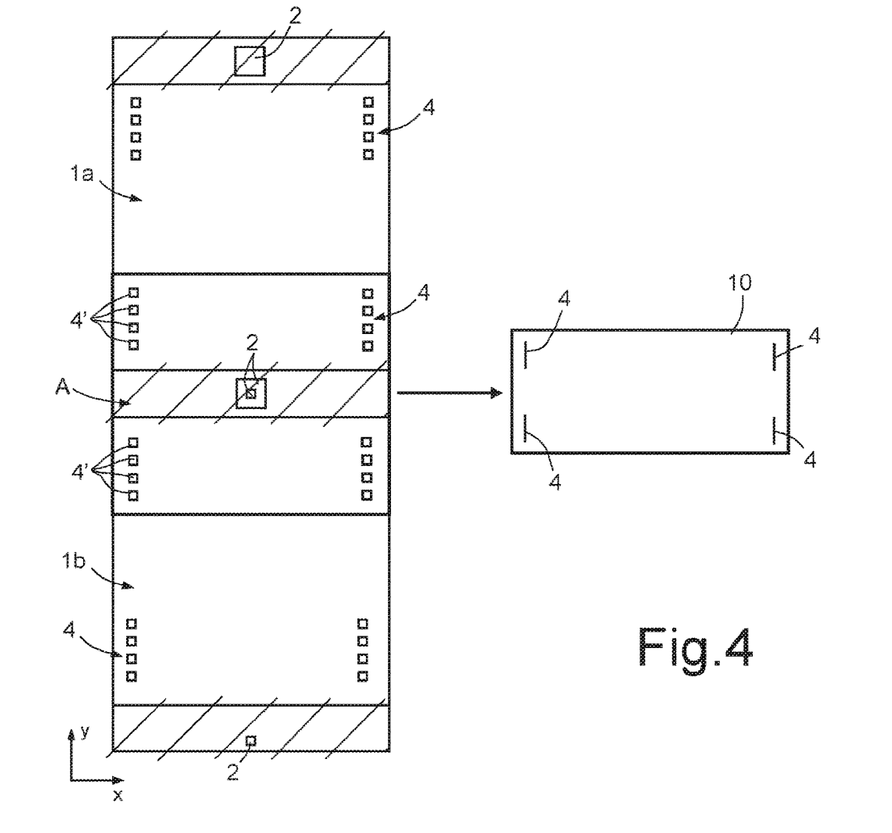
FIG. 4 is a schematic representation of a field mask alignment structure according to a first embodiment of the invention.

This feature is schematically shown in FIG. 4, which shows two traditional zero masks, identified again with 1*a* and 1*b* (a following field mask overlapping a previous field mask), where there are stitching marks 2 and reference marks 4; furthermore, there is the overlay area A between two field masks 1*a*, 1*b*.

As shown in FIG. 4, the present solution, suggesting a different approach aimed at the stitching of printing fields, envisages: eliminating the overlay area A; eliminating the stitching marks 2; and using the sole reference marks 4 for the alignment of the field masks of the following mask levels.

Indeed, the present solution envisages, at the first level, a suitable grid of alignment structures 10 for printing onto the wafer only reference marks 4, which are aimed at aligning, through overlapping, all the mask levels following the first one.

As mentioned above (even though this is not shown in detail in the following Figures to make sure that the drawings are easily understandable), each reference mark 4 comprises, to this purpose, a plurality of reference elements 4', in this case aligned along the second horizontal direction y, each one for the alignment of a respective one of the following mask levels (hence, the number of reference elements 4' depends on the number of mask levels; the number shown in the Figure is a mere example). In the example shown, each reference element 4' has a substantially square shape in the horizontal plane xy.

Figure 5:
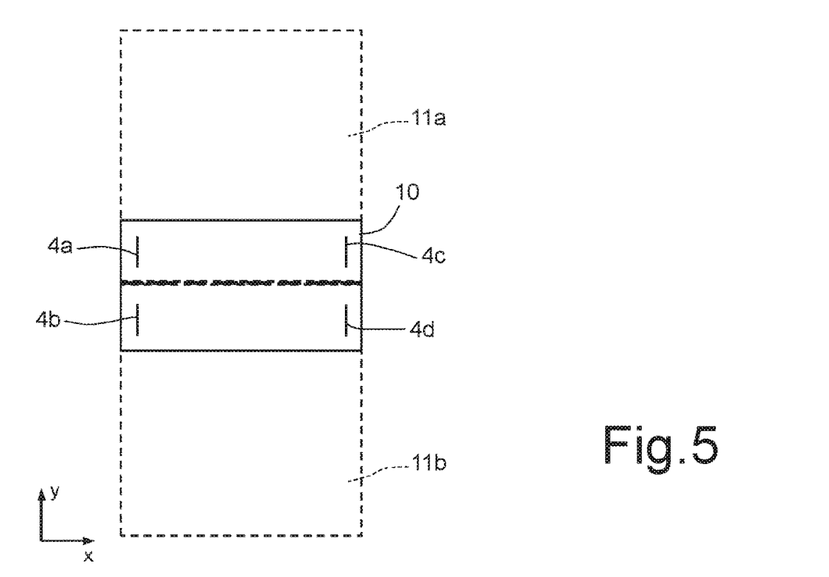
FIGS. 5 and 6 are schematic representations of the stitching of two field masks through the alignment structure of FIG. 4.

In particular, with reference also to FIG. 5, each alignment structure 5 comprises at least one first reference mark 4*a* for the alignment, at upper mask levels, of a first field mask, which is indicated with 11*a* in FIG. 5; and at least one second reference mark 4*b* for the alignment, at upper mask levels, of a second field mask, which is indicated with 11*b* in FIG. 5, so that the aforesaid first and second field masks 11*a*, 11*b* are arranged on the wafer adjacent to one another in the coupling direction (for example, along the second horizontal direction y), without any mutual overlay area. The first and the second reference marks 4*a*, 4*b* are aligned, in the example, along the same second horizontal direction y.

In particular, each alignment structure 10 is printed by means of a single photomask and a single photolithography process carried out on the wafer, in one single printing operation (which does not envisage the formation of structures of the integrated circuit to be manufactured).

The aforesaid alignment of the field masks of the upper levels, which will be generally denoted with 11, with the reference marks, which are generally denoted with 4 and are defined at the first mask level, is carried out in a known manner and, therefore, is not described in detail herein; to this regard, the optical photolithography machine is configured to identify the position of the reference marks 4 made on the wafer and to be positioned accordingly above the wafer, every time at the position required during the scanning of the wafer for the execution of the photolithography procedures.

In the embodiment shown in FIG. 5, each alignment structure 10 has a substantially rectangular shape in the horizontal plane xy, elongated along the second horizontal direction x, and it defines four reference marks 4, which are arranged at the corners of the rectangular shape, aligned in pairs along the first horizontal direction x and along the second horizontal direction y.

Therefore, in this case, the alignment structure 10 defines a third and a fourth reference marks 4*c*, 4*d*, and a first pair of reference marks 4 aligned along the first horizontal direction x (consisting, in this case, of the first and the third reference marks 4*a*, 4*c*) is used for the alignment of the first field mask 11*a*; and a second pair of reference marks 4 aligned along the same first horizontal direction x (consisting, in this case, of the second and the fourth reference marks 4*b*, 4*d*) is used for the alignment of the second field mask 11*b*, so that the first and the second field masks 11*a*, 11*b* are joined and aligned along the second horizontal direction y, without any overlay area.

In particular, since a single photomask and a single photolithography process are used for the optical photolithography machine to print the alignment structure and the relative reference marks 4 (and, in particular, at least the first and the second reference marks 4*a*, 4*b*), the aforesaid alignment between the first and the second field masks 11*a*, 11*b* at the following mask levels (with layer-to-layer alignment) is automatically ensured. Therefore, no alignment measurement and correction operations need to be carried out; as a matter of fact, no misalignment or mutual positioning error may occur by the optical photolithography machine in the formation of the set of reference marks 4 in the alignment structure 10.

Furthermore, the alignment structure 10 extends over an area whose surface is smaller than the printing area of the optical photolithography machine and the area of the field masks 11, which are subsequently stitched in order to print the dies of the overall integrated circuit, thus being less affected by possible distortions of the exposure lenses of the optical photolithography machine.

In particular, in the embodiment shown in FIG. 5, the size of the alignment structure 10 along the first horizontal direction x is equal to the corresponding size of the printing area, whereas the size of the same alignment structure 10 along the second horizontal direction y is smaller than the corresponding size of the same printing area.

Figure 6:
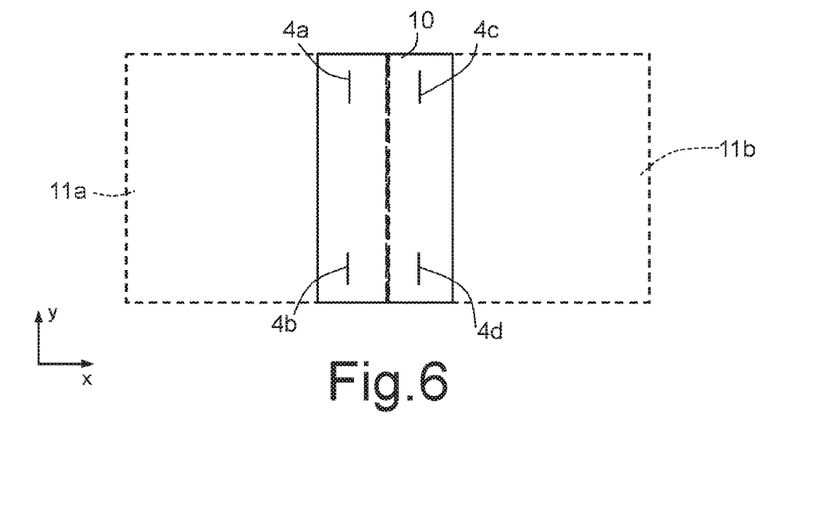

As shown in FIG. 6, in a variant of the embodiment, each alignment structure 10 can have a substantially rectangular shape in the horizontal plane xy, elongated along the second direction y.

Therefore, in this case, the alignment structure 10 defines a first pair of reference marks 4*a*, 4*b* aligned along the second horizontal direction y, which are used for the alignment of a first field mask 11*a*; and a second pair of reference marks 4*c*, 4*d* aligned along the same second horizontal direction y, which are used for the alignment of a second field mask 11*b*, so that the first and second field masks 11*a*, 11*b* are stitched and aligned adjacent to one another along the first horizontal direction x.

Figure 7:
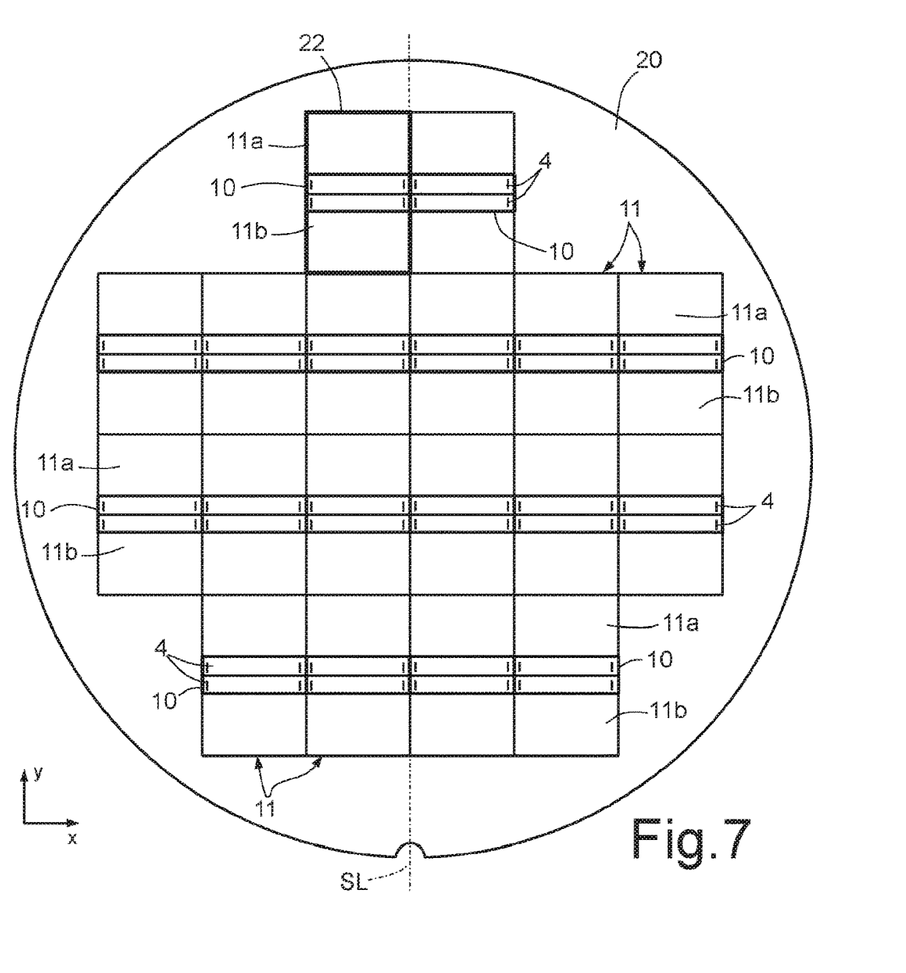
FIGS. 7 and 8 are schematic representations concerning the stitching of a plurality of field masks for manufacturing dies in a wafer, through the alignment structure of FIG. 4.

FIG. 7 shows a wafer 20 made of a semiconductor material, for example silicon, on which, at the first mask level, a grid of alignment structures 10 and of corresponding reference marks 4 is provided through the step-by-step movement of the optical photolithography machine, the alignment structures 10 being aligned in rows along the first horizontal direction and being adjacent to one another along each row (it is evident that, in a completely equivalent manner, the alignment structures 10 can also be arranged so as to be aligned in columns along the second direction y, in case the alignment structures 10 are made as described above with reference to FIG. 6).

Furthermore, the printing fields where, at each time, the optical photolithography machine is positioned are shown on the wafer, or, in a corresponding manner, the positioning of the field masks 11, that are each time used for the photolithography process and are stitched to one another through the alignment structures 10, is shown. These printing fields, as well, can be arranged in rows and columns, thus defining an array.

In this example, the grid of alignment structures 10 comprises a row of alignment structures 10 for every two rows of printing fields (or field masks 11); in other words, in this case there is an alternation between rows that are occupied and not occupied by respective alignment structures 10.

At the following mask levels, the field masks 11a, 11b are stitched in pairs in order to jointly define what will be a resulting die (FIG. 7 schematically shows only one die 22), thus exploiting the overlapping alignment relative to the reference marks 4 defined by the alignment structures 10 (the perfect alignment and stitching between the field masks 11a, 11b being automatically ensured, with no need for measurement and correction procedures).

In particular, in this case, every alignment structure 10 is positioned on the wafer 20 in a central position (along the second horizontal direction y) relative to the position subsequently taken by the pair of field masks 11a, 11b, which are stitched by means of the alignment structure 10 in order to form the die 22.

It is evident that, thanks to the alignment structures 10, a greater number of field masks 11 can be stitched together, in case an even larger size of the die 22 of the resulting integrated circuit is to be obtained.

Generally speaking, according to the embodiment shown, a resulting die consisting of a number n of rows and a single column of field masks 11 can be obtained, by using a number n−1 of alignment structures 10.

Figure 8:
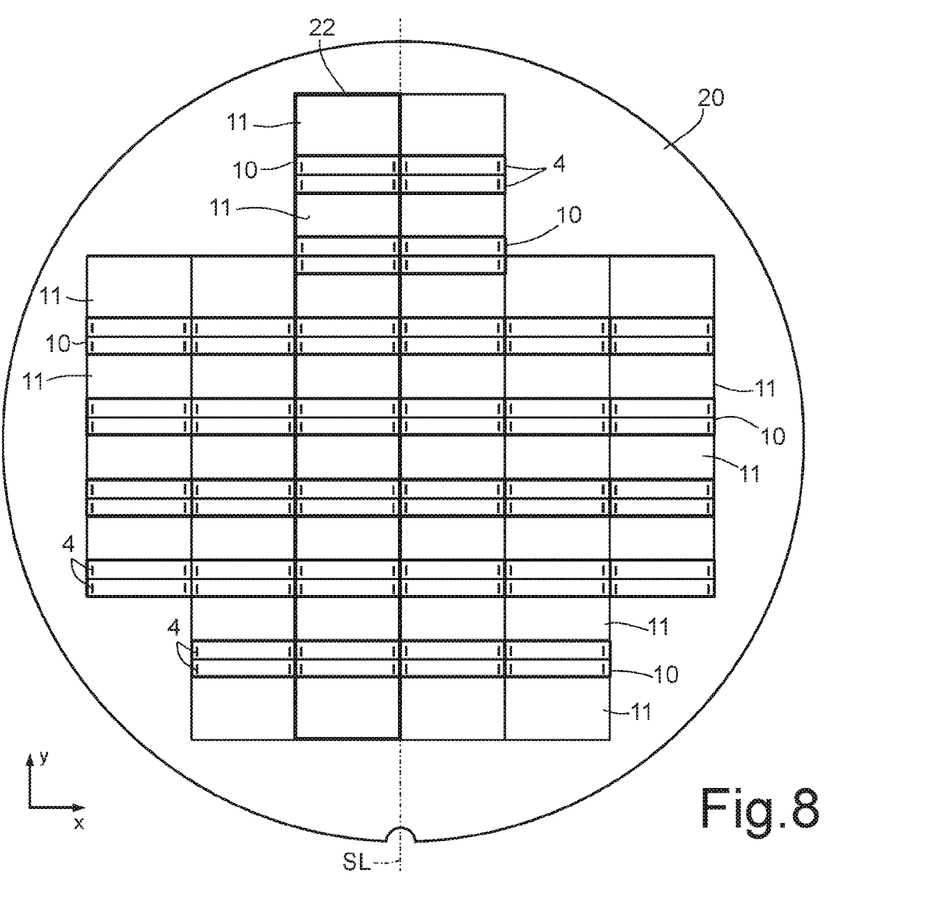

As schematically shown in FIG. 8, in this case the grid of alignment structures 10 can be arranged in such a way that a greater number of rows of alignment structures 10 are present on the wafer 20, if necessary all the rows (similarly, all the columns of alignment structures 10, in case of the variant discussed with reference to FIG. 6).

In any case, in general, the reference marks 4 defined by the alignment structures 10 are positioned at the scribe lines of the wafer 10, along which cuts will be made for the separation of the dies 22, so as not to interfere with the structures of the integrated circuits that are formed in the dies 22 (FIG. 7 and FIG. 8 show, by way of example, one single scribe line, which is indicated with SL). Furthermore, the reference marks 4 remain accessible and visible during the different processing steps to which the different levels of the integrated circuit are subjected, so as to allow all the subsequent mask levels to be aligned.

Figure 9:
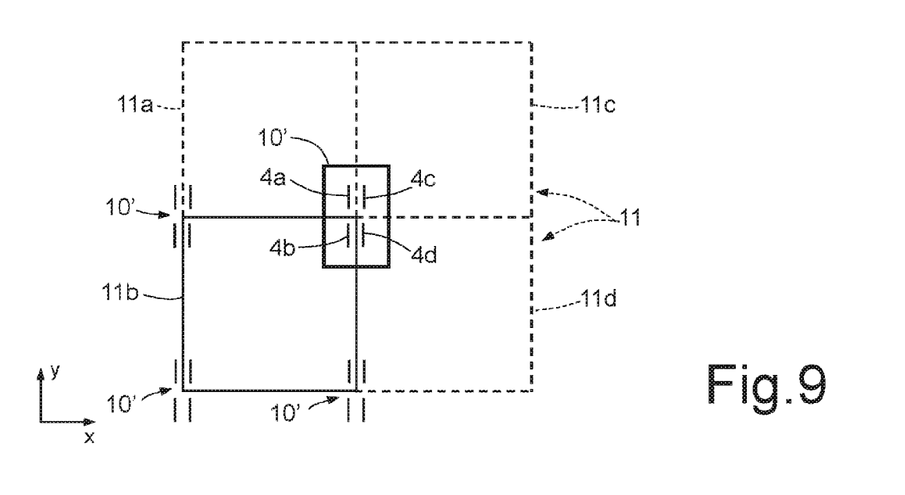
FIG. 9 is a schematic representation of a field mask alignment structure according to a second embodiment of the invention.

With reference to FIG. 9, a second embodiment of the present solution will now be described, which involves the possibility of stitching field masks 11 both in the first and in the second horizontal directions x, y, using a same alignment structure, which is herein indicated with 10'.

The alignment structure 10', also in this case, is formed—at the first level—by means of a suitable photomask and comprises, formed through the same photomask and by means of the same photolithography procedure: at least one first reference mark 4a for the alignment, at upper mask levels, of a first field mask, again indicated with 11a; at least one second reference mark 4b for the alignment, at upper mask levels, of a second field mask, indicated with 11b, so that the aforesaid first and second field masks 11a, 11b are arranged on the wafer 20 adjacent to one another in a first coupling direction (in the example, along the second horizontal direction y), without any mutual overlay area; and, furthermore, at least one third reference mark 4c for the alignment, at upper mask levels, of a third field mask, indicated with 11c, so that the aforesaid first and third field masks 1a, 1c are arranged on the wafer 20 adjacent to one another in a second coupling direction (in the example, along the first horizontal direction x), again without any mutual overlay area.

In the embodiment shown in FIG. 9, the alignment structure 10' comprises, furthermore, a fourth reference mark 4d for the alignment, at upper mask levels, of a fourth field mask, indicated with 11d, so that the aforesaid second and fourth field masks 11b, 11d are arranged on the wafer 20 adjacent to one another in the second coupling direction (in the example, along the first horizontal direction x), again without any mutual overlay area.

The alignment structure 10' has a substantially rectangular shape in the horizontal plane xy and defines the four reference marks, indicated in general with 4, which are arranged at the corners of said rectangular shape and are aligned in pairs along the first and the second horizontal directions x, y.

The alignment structure 10' has an area that is much smaller than the maximum printing area of the optical photolithography machine and the area of the field masks 11, which are subsequently stitched in order to print the dies 22 of the overall integrated circuit, thus being even less affected by possible distortions of the exposure lenses of the optical photolithography machine.

In particular, in the embodiment shown in FIG. 9, the size of the alignment structure 10', along both the first and the second horizontal direction x, y, is smaller than the corresponding size of the printing area.

Figure 10:
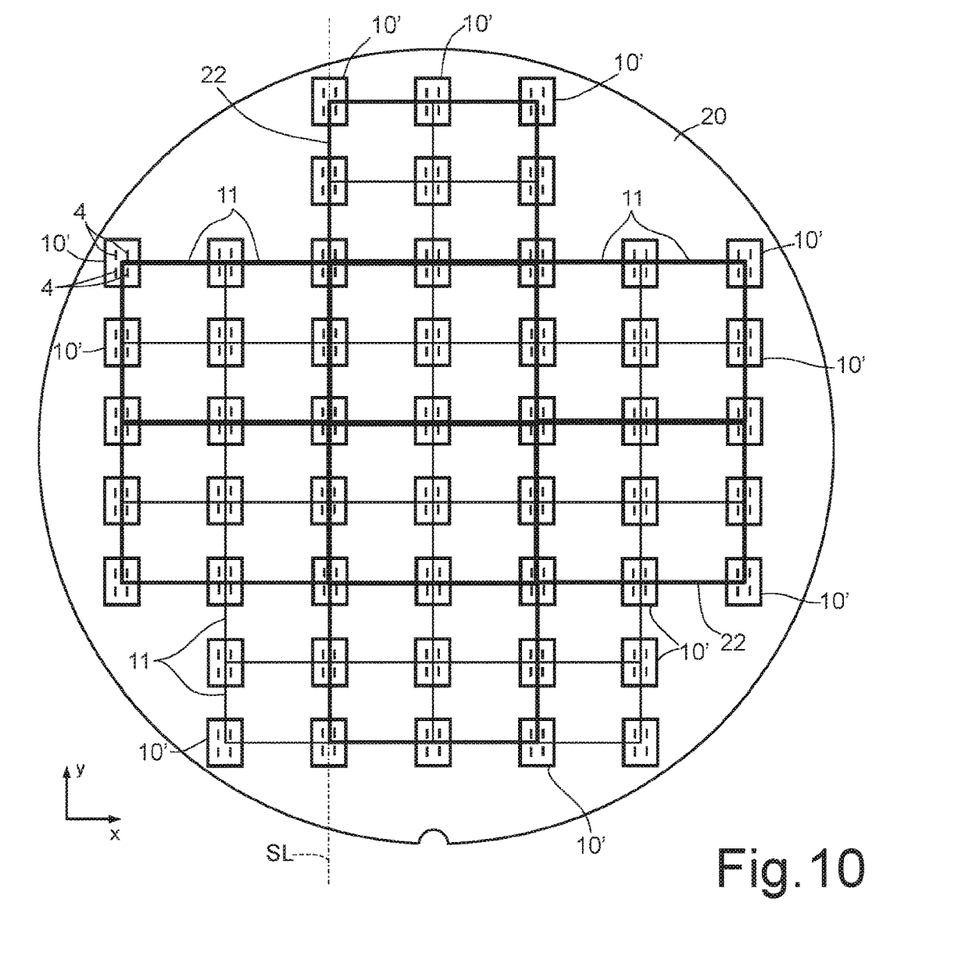
FIG. 10 is a schematic representation concerning the stitching of a plurality of field masks for manufacturing dies in a wafer, through the alignment structure of FIG. 9.

FIG. 10 shows—again—the wafer 20 with the pattern of printing fields where, step by step, the optical photolithography machine is positioned as well as, in a similar manner, the pattern of the field masks 11 that are used each time for the photolithography process and are stitched by means of the alignment structures 10'.

FIG. 10 further schematically shows the dies 22 resulting from the stitching of the printing fields by means of the alignment structure 10', in this case four of them.

The alignment structures 10' are placed on the wafer 20 in a position corresponding to the four corners of the printing fields or, similarly, of the field masks 11, thus forming a regular grid. The same alignment structures 10' are further arranged in a central position relative to the position that will be taken by the first, the second, the third and the fourth field masks 11a, 11b, 11c, 11d, which are stitched adjacent to one another.

In general, the reference marks 4 defined by the alignment structures 10' are positioned at the scribe lines SL of the wafer, so as not to interfere with the structures of the integrated circuits that are formed in the dies 22. It may be advantageous, when possible, to eliminate the reference marks 4 that are possibly present inside the dies 22.

Figure 11:
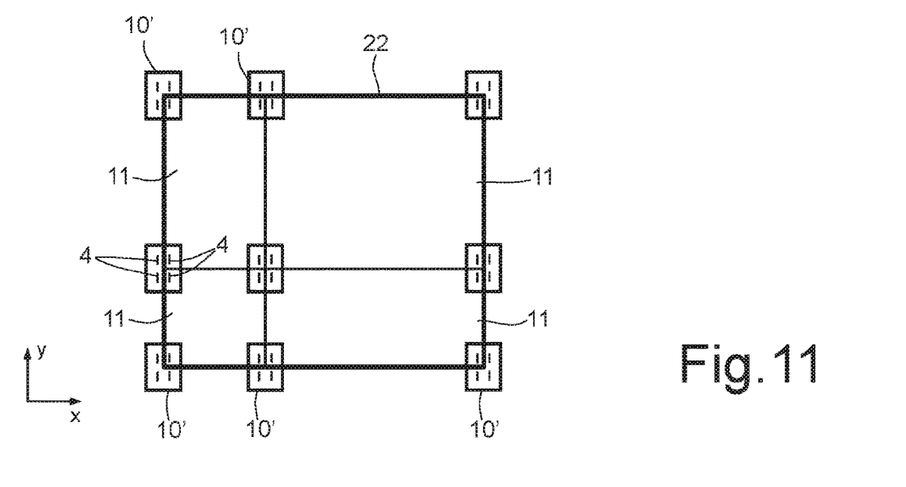
FIG. 11 is a schematic representation concerning the stitching of field masks with different sizes, through the alignment structure of FIG. 9.

As shown in FIG. 11, the solution described herein further allows to stitch together printing fields (similarly, field masks 11) with a different area, in case this is allowed by the optical photolithography machine used for manufacturing the integrated circuits.

In this case, the spacing of the alignment structures 10' in the grid is not regular (similar considerations can also be applied to the alignment structures 10 of the first embodiment described above).

In the solution shown, by mere way of example, in FIG. 11, the areas of the printing fields that are stitched in order to obtain the resulting die 22 are all different from one another.

The sizes of each printing field along the first and the second horizontal directions x, y are defined by the spacing in the grid between corresponding alignment structures 10'.

Again, as already discussed in detail above, there is an accurate stitching both in the first and in the second horizontal direction x, y, thanks to the use, for the layer-to-layer alignment of the field masks 11 of the following levels, of reference marks 4 that are printed by means of a same photolithography procedure and a same photomask (the positioning of the reference marks 4, therefore, cannot be affected by errors).

This second embodiment generally allows the manufacturing, starting from the wafer 20, of dies formed through the stitching of n×m printing fields (n and m being any numbers, equal to or different from one another, compatible—of course—with the size of the wafer 20).

Figure 12:
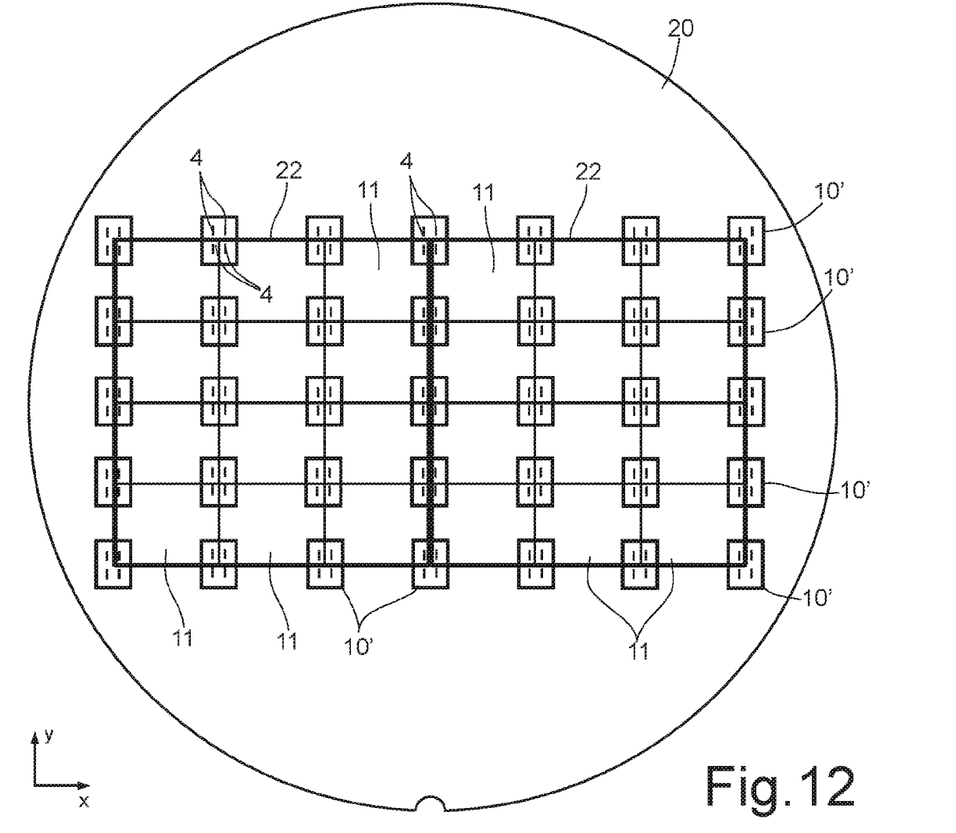
FIG. 12 is a further schematic representation concerning the stitching of a plurality of field masks for manufacturing dies in a wafer, through the alignment structure of FIG. 9.

To this regard, by way of example, FIG. 12 shows the manufacturing of dies 22 consisting of four rows and three columns of printing fields, through the stitching of a total of twelve printing fields, in this case all having the same exposure area.

The advantages of the solution described herein are clear from the above description.

In any case, it is again underlined that the alignment method according to the invention allows to eliminate the stitching marks at the first mask level, as well as the adjustment and correction operations associated with the same stitching marks, thus simplifying the manufacturing process and, furthermore, increasing the efficiency of the same manufacturing process.

In particular, the alignment method does not require the presence of overlay areas between the printing fields, thus allowing the entire exposed area to be used for the manufacturing of the integrated circuits.

Furthermore, the accuracy of the alignment between the printing fields is improved compared to traditional solution.

The solution described herein ensures a great freedom in the stitching of a desired number of printing fields for the creation of the resulting dies, which can have the same area of even different areas, advantageously using one single type of alignment structure, which is printed onto the wafer, forming a grid of alignment structures.

Figure 13:
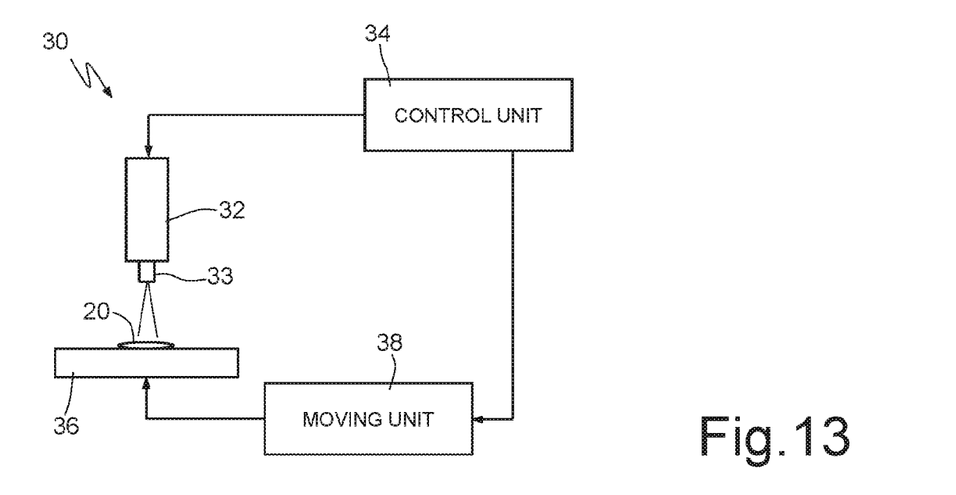
FIG. 13 is a schematic block diagram of a photolithography system for processing a wafer.

FIG. 13 schematically shows an optical photolithography system, indicated in general with 30, in which the alignment method described above can find advantageous application.

The optical photolithography system 30 comprises: an optical photolithography machine 32, which is designed to carry out photolithography procedures on a wafer 20 of semiconductor material and is provided with an optical projector 33, for example a laser projector; a control unit 34, which is designed to control the optical projector 33 for the execution of photolithography procedures and comprises, in particular, a processor and a memory, which stores suitable computer instructions that, when executed by the processor, allows the alignment method described above to be carried out; a carrier 36, which is designed to support the wafer 20; and a moving unit 38, which is controlled by the control unit 34 to move the wafer 20 (by moving the relative carrier 36) and obtain a suitable mutual positioning between the wafer 20 and the optical projector 33.

Finally, it is clear that the solution described above can be subject to changes and variations, without for this reason going beyond the scope of the invention as defined in the appended claims.

In particular, the number of printing fields that can be stitched together by means of the alignment method according to the invention can be different from the one discussed above, for manufacturing of dies with a desired size.

The invention claimed is:

1. A photomask alignment method for a manufacturing process of an integrated circuit in a semiconductor material wafer, the method comprising:

at a first level, defining, by means of a single photolithography process, at least one alignment structure on said wafer, said alignment structure comprising at least a first and a second reference mark; and at an upper level, higher than the first level, aligning a first field mask relative to said at least one first reference mark; and aligning a second field mask, which is used, together with said first field mask, for the photolithography formation of said integrated circuit inside a respective die in said wafer, relative to said at least one second reference mark, so that said first and second field masks are arranged on the wafer adjacent to one another in a first coupling direction, without any mutual overlapping, wherein said wafer has a main extension in a horizontal plane (xy), and wherein said alignment structure further comprises a third and a fourth reference marks, which are aligned in pairs with said first and second reference marks along a first (x) and along a second (y) direction of said horizontal plane (xy); said first, second, third and fourth reference marks being printed onto the wafer by means of said single photolithography process;

wherein aligning said first field mask comprises aligning said first field mask relative to said first and third reference marks; and wherein aligning said second field mask comprises aligning said second field mask relative to said second and fourth reference marks.

2. The method according to claim 1, wherein said alignment structure has, in said horizontal plane (xy), an extension area that is smaller than a printing field defined by each one of said first and second field mask.

3. The method according to claim 1, wherein said reference structure is arranged on said wafer in a central position, along the first coupling direction, relative to the position that is designed to be taken by said first and second field masks, stitched adjacent to one another.

4. The method according to claim 1, wherein said reference structure has a size along one between said first (x) and second (y) directions that is equal to a corresponding size of said first and second field masks, and a size along the other one between said first (x) and second (y) directions that is smaller than a corresponding size of said first and second field masks.

5. The method according to claim 1, further comprising, at said upper level higher than the first level, aligning a third field mask relative to said third reference mark, so that said first and third field masks are arranged on the wafer adjacent to one another in a second coupling direction, without any mutual overlapping; said third field mask being used, together with said first and second field masks for the photolithography formation of said integrated circuit inside a respective die in said wafer.

6. The method according to claim 5, further comprising, at said upper level higher than the first level, aligning a fourth field mask relative to said fourth reference mark, so that said second and fourth field masks are arranged on the wafer adjacent to one another in said second coupling direction, without any mutual overlapping; said fourth field mask being used, together with said first, second and third field masks for the photolithography formation of said integrated circuit inside a respective die in said wafer.

7. The method according to claim 6, wherein said reference structure is arranged on said wafer at a common corner of said first, second, third and fourth field masks, in a central position relative to the position that is designed to be taken by said first, second, third and fourth field masks, stitched adjacent to one another.

8. The method according to claim 5, wherein said reference structure has a respective size along said first (x) and second (y) directions that is smaller than a corresponding size of said first and second field masks.

9. The method according to claim 1, wherein defining, at said first level, comprises defining a plurality of alignment structures on said wafer, each comprising a respective first and second reference marks and arranged in a grid on said wafer along the first and along a second coupling direction; each alignment structure being defined by a respective single photolithography process.

10. The method according to claim 9, wherein the distances between said alignment structures along said first and second coupling directions define corresponding sizes of said field masks.

11. The method according to claim 10, wherein the sizes of said field masks are different from one another and different for one or more of said field masks.

12. The method according to claim 9, wherein defining a plurality of alignment structures on said wafer comprises iteratively repeating the operations of: printing an alignment structure onto an area of said wafer through a single mask and a single photolithography process by means of an optical photolithography machine; and changing a relative position of said wafer relative to said optical photolithography machine, so as to align the photomask on a different area of said wafer, prior to repeating said printing step.

13. The method according to claim 1, wherein each one of said reference marks comprises a plurality of reference elements, each one for the alignment of a respective photolithography process at an upper level higher than the a first one, relative to the a lower level.

14. A photomask alignment method for a manufacturing process of an integrated circuit in a semiconductor material wafer, the method comprising:
at a first level, defining, by means of a single photolithography process, at least one alignment structure on said wafer, said alignment structure comprising at least a first and a second reference mark; and
at an upper level, higher than the first level, aligning a first field mask relative to said at least one first reference mark; and aligning a second field mask, which is used, together with said first field mask, for the photolithography formation of said integrated circuit inside a respective die in said wafer, relative to said at least one second reference mark, so that said first and second field masks are arranged on the wafer adjacent to one another in a first coupling direction, without any mutual overlapping,
wherein said wafer has a main extension in a horizontal plane (xy), and wherein said alignment structure further comprises a third and a fourth reference marks, which are aligned in pairs with said first and second reference marks along a first (x) and along a second (y) direction of said horizontal plane (xy); said first, second, third and fourth reference marks being printed onto the wafer by means of said single photolithography process;
wherein aligning said first field mask relative to said at least one first reference mark, and aligning said second field mask relative to said at least one second reference mark comprise: optically detecting a position of said first and respectively second reference mark on said wafer; and aligning said first and respectively second field mask relative to the detected position of said first and respectively second reference mark on said wafer.

15. A process for manufacturing an integrated circuit in a die of a semiconductor material wafer, comprising aligning at least one first field mask and a second field mask by means of the method according to claim 1.

16. The process according to claim 15, further comprising carrying out processing steps of said integrated circuit in an area of said wafer that is jointly defined by the stitching of said first and second field masks, said processing steps including the exposure, through said first and second field masks, of a photoresist layer coating the wafer and the processing of said wafer through the exposed photoresist layer.

17. An optical photolithography system comprising an optical photolithography machine, which is designed to carry out photolithography procedures on a semiconductor material wafer and is provided with an optical projector and with a control unit, which is configured to control said optical projector according to the alignment method according to claim 1.

* * * * *